United States Patent [19]
Perelle

[11] Patent Number: 5,578,927
[45] Date of Patent: Nov. 26, 1996

[54] MEASUREMENT CIRCUIT FOR A MODULAR SYSTEM OF CELLS ELECTRICALLY CONNECTED IN SERIES, IN PARTICULAR FOR ELECTRICAL ACCUMLATOR BATTERIES

[75] Inventor: Michel Perelle, Parcay-Meslay, France

[73] Assignee: SAFT, Romainville, France

[21] Appl. No.: 354,759

[22] Filed: Dec. 8, 1994

[30] Foreign Application Priority Data

Dec. 9, 1993 [FR] France ..................... 93 14798

[51] Int. Cl.$^6$ ............... G01N 27/416; G01R 31/36
[52] U.S. Cl. ............................ 324/434; 324/426
[58] Field of Search .................... 324/426, 434; 340/636; 320/15, 17, 48

[56] References Cited

U.S. PATENT DOCUMENTS

| | | | |
|---|---|---|---|
| 4,931,738 | 6/1990 | MacIntyre et al. | 324/435 |
| 5,055,763 | 10/1991 | Johnson et al. | 320/15 |
| 5,099,211 | 3/1992 | Nowak | 324/434 |
| 5,371,682 | 12/1994 | Levine et al. | 324/434 X |
| 5,469,042 | 11/1995 | Ruhling | 320/17 |

FOREIGN PATENT DOCUMENTS

| | | |
|---|---|---|
| 0112242A1 | 6/1984 | European Pat. Off. . |
| 0277321A1 | 8/1988 | European Pat. Off. . |

OTHER PUBLICATIONS

"A Voltage Monitoring System . . . Multicell . . . Daisy-Chained Sesrial . . . At Each Node", *Research Disclosure*, No. 344, Dec. 1992, pp. 929–930.

Primary Examiner—Kenneth A. Wieder
Assistant Examiner—Glenn W. Brown
Attorney, Agent, or Firm—Sughrue, Mion, Zinn, Macpeak & Seas

[57] ABSTRACT

A measurement circuit for a modular system of cells electrically connected in series, in particular for electrical accumulator batteries, includes individual interfaces respectively connected to each power terminal of a different cell and each including a single-wire measurement output for a current measurement signal to be transmitted to a common transducer via a common single-wire connection. The interfaces each incorporate a switchable measurement current generator. They are connected in series by successive elements of a single-wire connection enabling serial transmission of individual switching control pulses grouped into streams for the current generators.

4 Claims, 5 Drawing Sheets

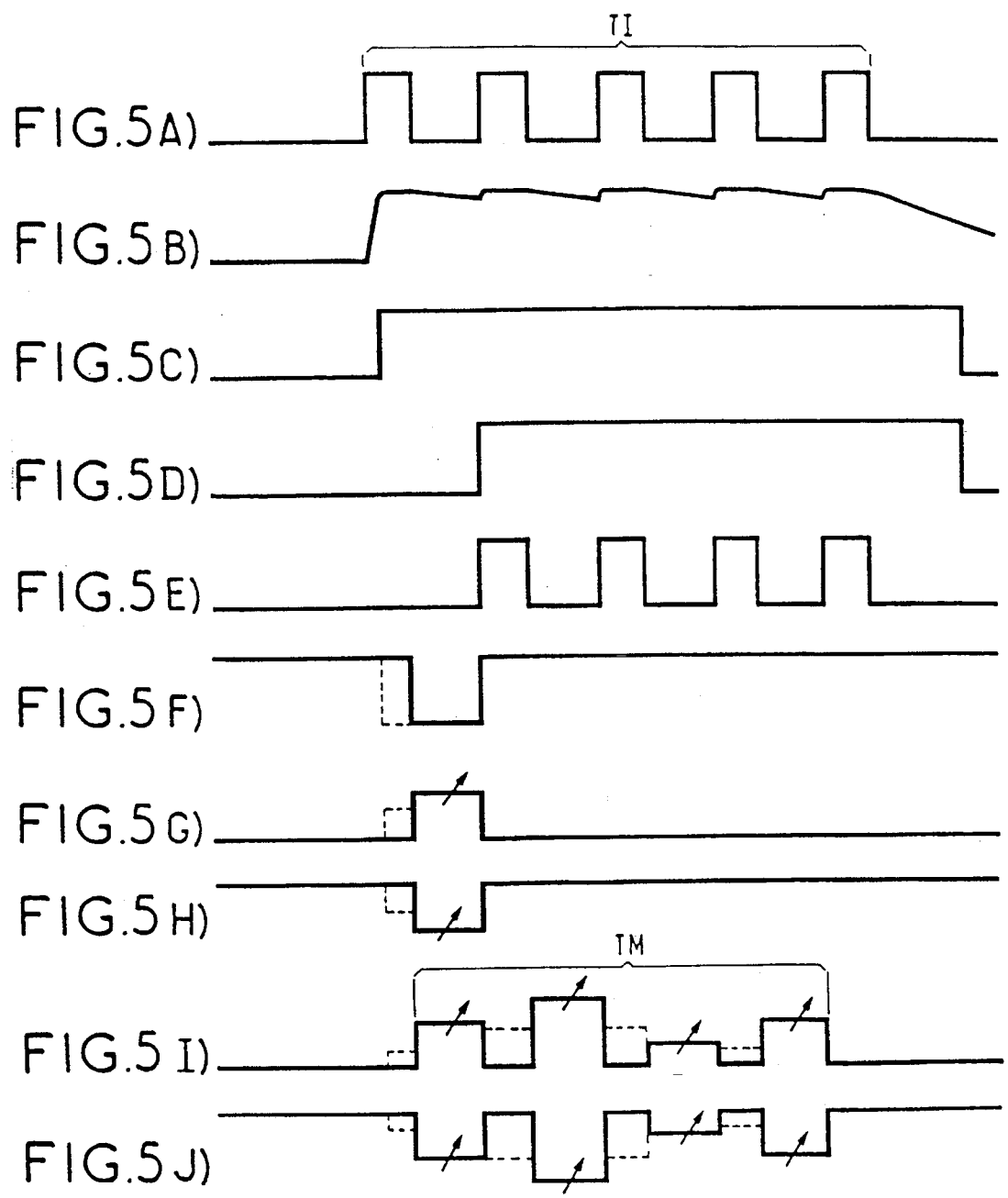

5,578,927

MEASUREMENT CIRCUIT FOR A MODULAR SYSTEM OF CELLS ELECTRICALLY CONNECTED IN SERIES, IN PARTICULAR FOR ELECTRICAL ACCUMLATOR BATTERIES

BACKGROUND OF THE INVENTION

1. Field of the Invention

The invention concerns a measurement circuit for a modular system of cells electrically connected in series.

2. Description of the Prior Art

The operation of some modular electrical systems made up of series-connected cells can be optimized, especially if the number of cells is relatively large, if it is easy to monitor the operation of each cell and thus if it is possible to carry out measurements on an individual cell or, failing this, on a small group of cells within the same system. This may be the case, for example, for modular accumulator battery, supercapacitor, superconverter or other type systems made up of cells whose individual performance may need to be monitored.

Although it may appear simple in theory, implementing a circuit able to carry out such measurements, for example electrical voltage measurements on each cell, is complicated if the number of elements is large. The large number of measurement wires then required usually leads to relatively complex implementations involving the use of switching means requiring a large number of switching units. As a result, especially if the switching means are of the electromagnetic type, these circuits have been little used, most often only in specific applications in which they are virtually indispensable.

The invention therefore proposes a measurement circuit for a modular system of cells electrically connected in series each constituted by one or more elements producing, accumulating or converting electrical energy, in particular electrical accumulator battery cells.

SUMMARY OF THE INVENTION

In accordance with the invention, the measurement circuit comprises individual measurement interfaces each respectively connected to the power terminals of a different cell and each including a single-wire measurement output for a current measurement signal to be transmitted to a common transducer to which the respective measurement outputs of the interfaces are connected in common via a common single-wire connection in the measurement circuit in question, each interface incorporates at least a first current generator for generating a current measurement signal relating to a change in characteristic of the corresponding cell, and the interfaces are connected in series by successive elements of a single-wire connection capable of serially transmitting individual switching control pulses grouped into streams for the current generators of the interfaces, each interface having a control circuit adapted to respond to the first command pulse of a stream that it receives by turning on the measurement current generator of the interface which includes it and transmitting any subsequent pulse of the same stream to any interface on its downstream side whose input is connected to its own output via an element of the single-wire connection.

The invention, its features and its advantages are explained in the following description given with reference to the figures listed below.

BRIEF DESCRIPTION OF THE DRAWINGS

FIG. 5 shows a timing diagram relating to the operation of the circuits shown in FIGS. 3 and 4.

DETAILED DESCRIPTION OF THE PREFERRED EMBODIMENTS

Figure 1:
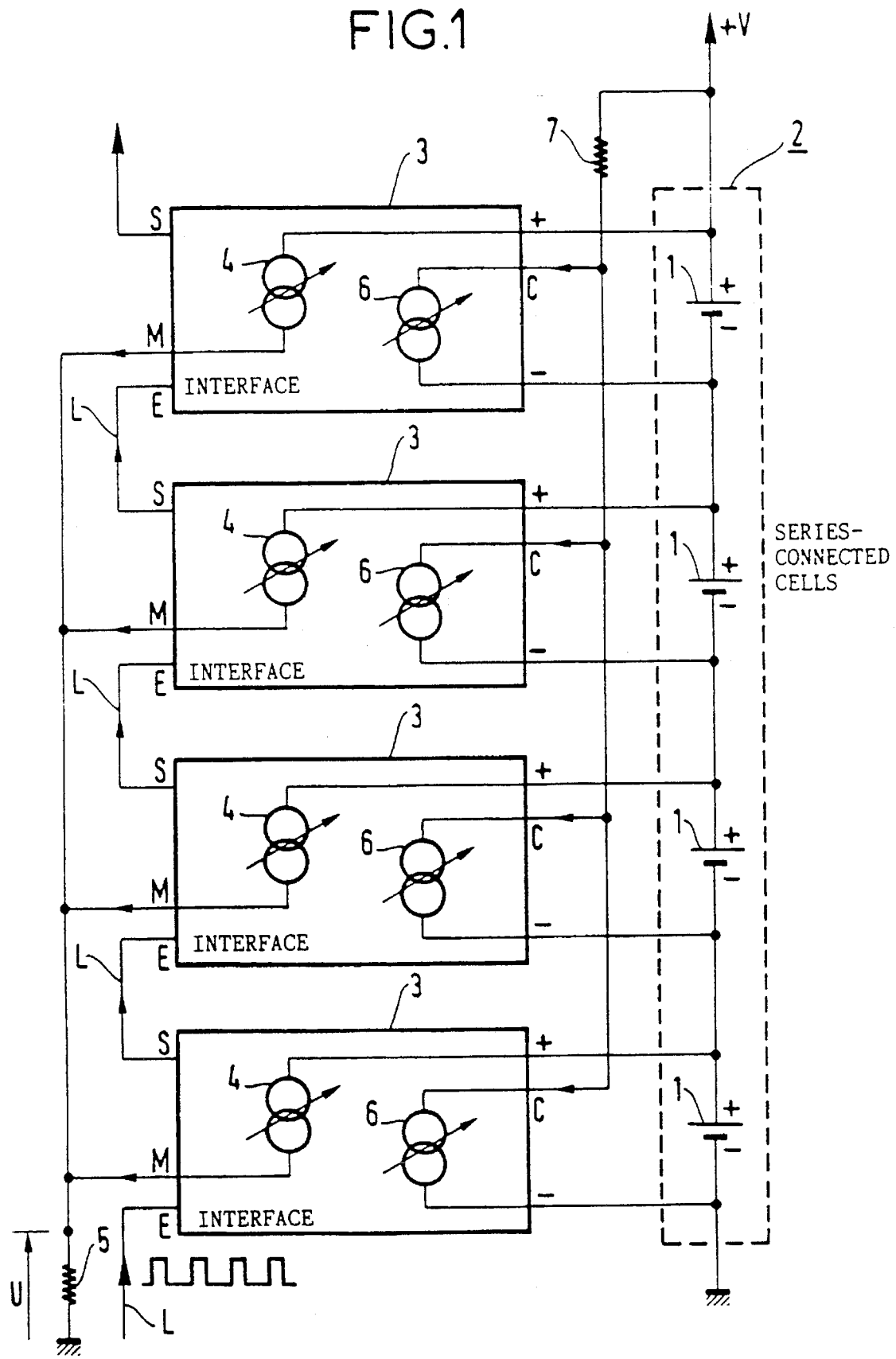
FIG. 1 shows a circuit diagram of a measurement circuit in accordance with the invention.

Referring to FIG. 1, the measurement circuit in accordance with the invention is designed to be associated with a modular electrical system made up of a plurality of cells 1 connected in series at energy transmission terminals of the cells, each cell having two such terminals marked "+" and "−" in the conventional way. The system 2 is made up of cells 1 each made up of one or more elements which produce, accumulate or convert electrical energy, for example, and the measurement circuit is designed to enable collection of information relating to the operation of the cells, specifically at the individual cell level.

The measurement circuit shown in schematic form in FIG. 1 is primarily intended to determine the value of the direct current voltage at the terminals of each of the cells 1 of a modular electrical system 2 made up of accumulator battery type electrical power supply elements or blocks of such elements. The cells of the system are connected in series at their energy transmission terminals, each cell being identically made up of one or more elements and having two "+" and "−" energy transmission terminals.

According to the invention the circuit has individual measurement interfaces 3 for each cell 1 of the system 2 with which it is associated. Each interface 3 is connected to the energy transmission terminals "+" and "−" of one of the cells and includes a switchable current generator 4 shown here inserted between the "+" terminal of the cell 1 with which it is associated and a terminal of a transducer 5. The transducer 5, which is a resistor, for example, converts the current supplied by a current generator 4 of an interface 3 via a single wire into a voltage U imaging the magnitude measured at this interface, in this example the voltage at the terminals of the cell to which the interface in question is assigned, when the current generator is turned on.

In the proposed implementation the transducer 5 is common to all the individual interfaces 3 of the measurement circuit, being identically connected by one of its two terminals to a ground potential common to the measurement circuit and to the system formed by the series-connected cells 1 and by its other terminal to a single-wire individual measurement output M of each of the respective current generators 4 of the interfaces 3 via a common single-wire connection.

Figure 2:
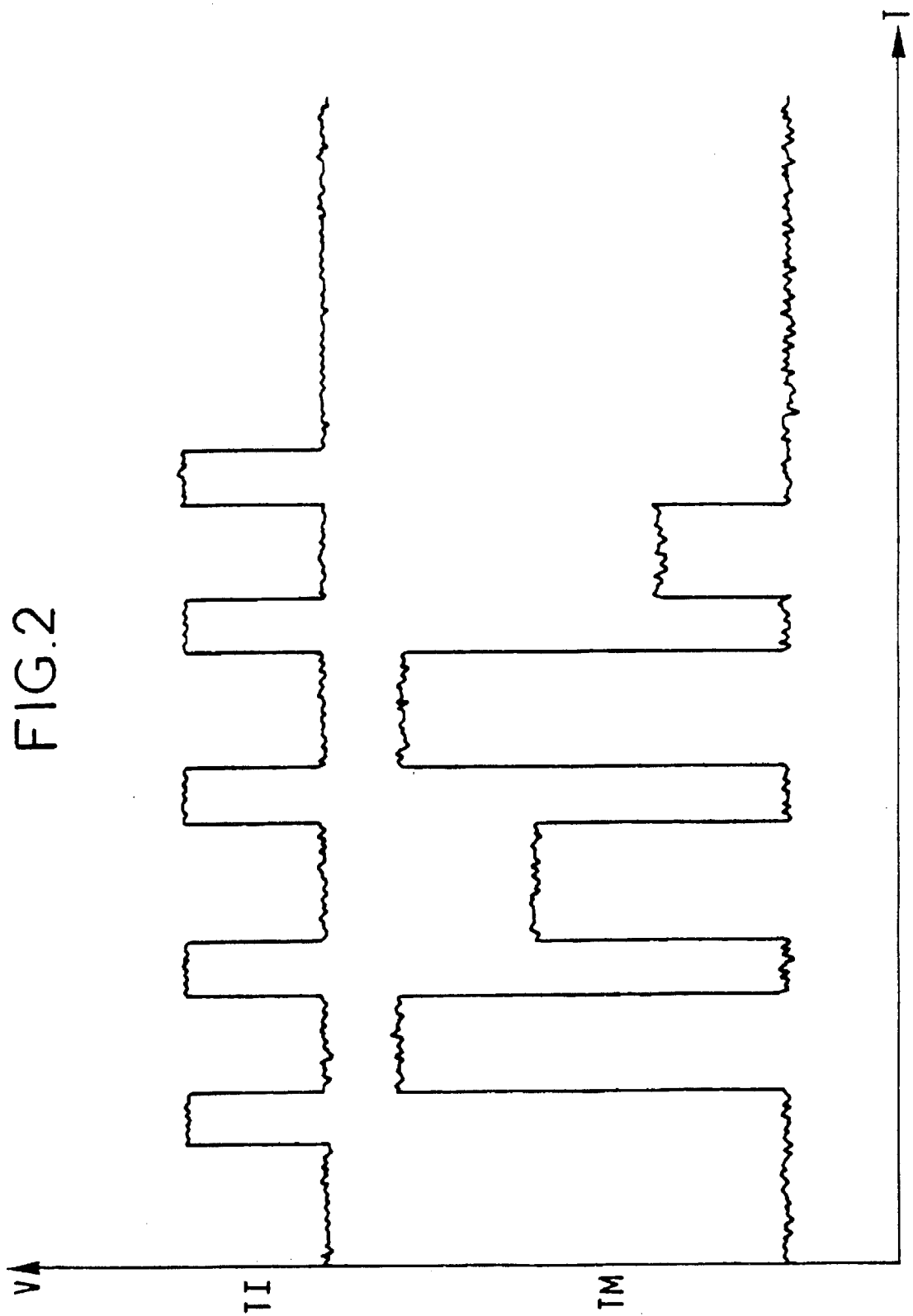
FIG. 2 shows a timing diagram relating to the operation of a measurement circuit in accordance with the invention.

Each current generator 4 is switched by a command pulse which is transmitted in a stream TI of command pulses in which each pulse is addressed to a specific interface of the sequence of series-connected interfaces 3 of the measurement circuit. Referring to FIG. 2, a command pulse stream TI is sent by conventional type generator means of supervisory logic (not shown) to the input E of the interface 3 for a lead cell 1 at one end of the series-connected interfaces 3, the lead cell in this example being that whose negative terminal "−" is connected direct to a ground potential of the system 2.

Each interface is adapted to respond to the first pulse of a command stream that it receives and transmits any subsequent pulses of this stream to the interface on its downstream side whose input E is connected to its own output S by an element of a sectional single-wire link L.

The current generator 4 is turned on, in a manner explained below, by the pulse from a command stream to which the interface 3 which includes it responds. It then supplies a current to the transducer 5 which is conditioned by the cell 1 to which the interface in question is assigned. If the transducer 5 is a resistor, a voltage appears across this resistor which represents the voltage between the terminals of the cell 1. Each successive pulse of a command stream TI activates temporarily the current generator 4 of one of the interfaces in the sequential order of these interfaces starting from that which receives the first pulse of the stream. This is symbolically represented by the curve TM in FIG. 2 which shows a typical read-out obtained from a command stream TI made up of periodic binary pulses. These pulses or, in the present context, the binary zero levels of the pulses of the same stream TI, successively turn on the current generators 4 of each interface 3 connected to the cells 1, starting from that interface which receives and retains the first pulse of the command stream, in this example that assigned to the cell connected direct to the common ground potential. A stream TM of voltage pulses therefore appears across the resistor constituting the transducer 5 in which each pulse, each positive pulse in this example, is representative of the voltage between the terminals of the cell whose current generator 4 is connected in circuit with this transducer resistor at this time. The diagram shows four different voltage values.

Additionally, if the current sampled at each cell of the system 2 during successive measurements carried out under the control of a stream of pulses must be balanced, there is provision for associating a switchable second current generator 6 in each interface 3 and a common compensator 7 at least approximately equivalent to the transducer 5 in the measurement circuit. The compensator 7, which may be a resistor, for example, is connected to the positive terminal "+V" of the system 2 of cells 1 and to each of the second current generators of the measurement circuit by a second terminal. Each second current generator 6 is assumed to be switched by the same command pulse as the current generator 4 associated with it in the interface 3 including them. It is inserted between the common compensator 7 of the measurement circuit, to which it is connected by a terminal C, and the "−" terminal of the cell 1 to which the interface 3 which includes it is assigned.

Thus commanding an interface 3 assigned to a cell 1 leads to a sampling of energy, possibly shared, to the benefit of the first current generator 4 of this interface at this cell 1 at least, as well as at any other cell 1 of the system 2 inserted between the ground potential and said cell 1 to which the interface in question is assigned. At the same time, energy is sampled, also possibly shared, to the benefit of the second generator of the same interface 3 at the cell 1 at least to which the interface is assigned, as well as at any other cell 1 of the system 2 inserted between the positive terminal "+V" of this system and said cell 1 to which the interface in question is assigned. This leads to balanced distribution of sampling at all the cells of the system 2 on each series of measurements corresponding to a complete stream of command pulses.

Figure 3:
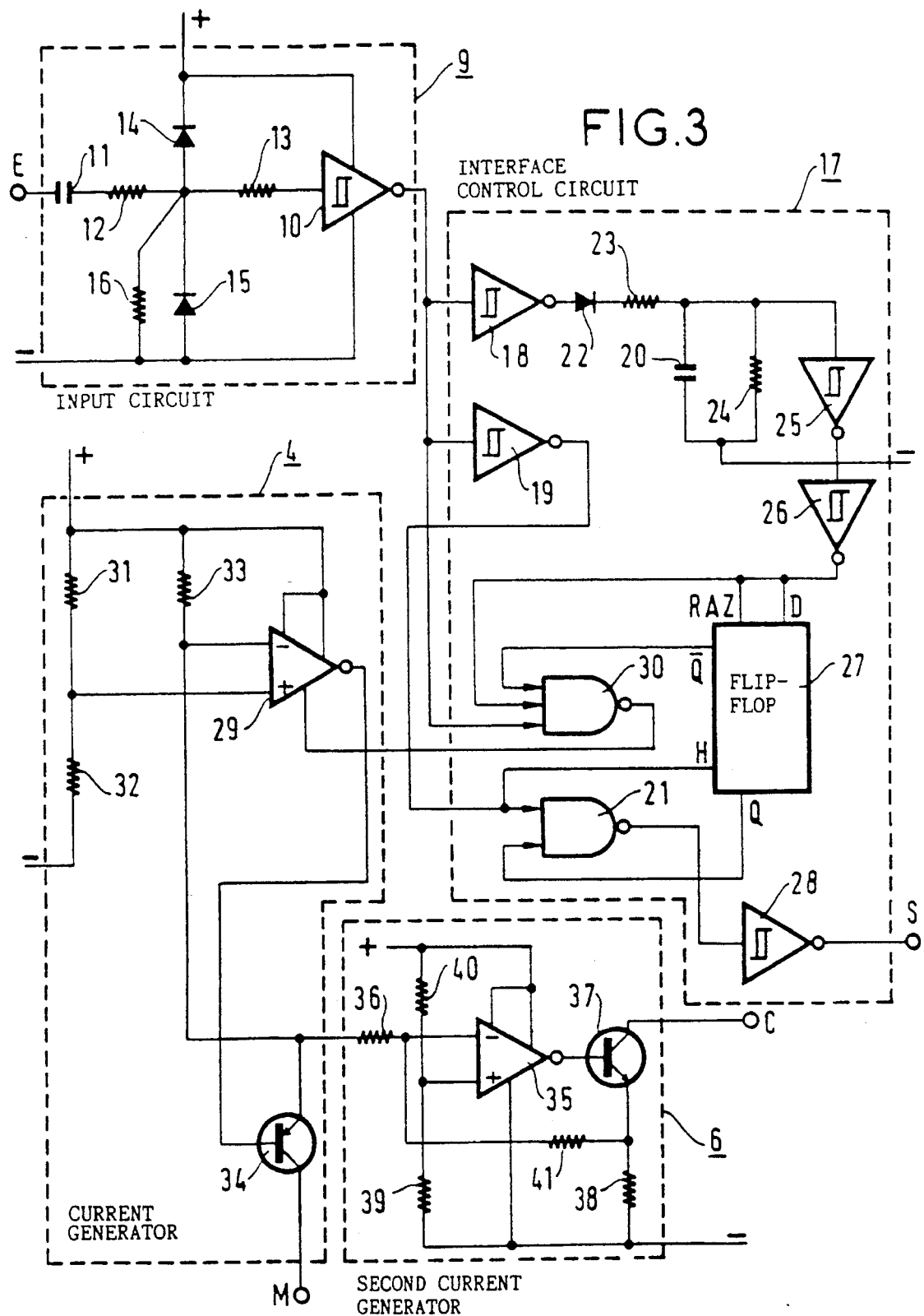
FIG. 3 is an electrical circuit schematic of one embodiment of an individual cell interface for a measurement circuit in accordance with the invention.

FIG. 3 shows a first embodiment of an individual cell measurement interface for a circuit in accordance with the invention. This interface 3 receives any command pulse transmitted to it by a downstream single-wire connection element L at an input E to which is connected an input circuit 9 which reshapes the pulses received. A command stream for carrying out measurements on a set of four cells is shown by way of example in diagram A of FIG. 5. It comprises five identical pulses shown as being at least approximately equally spaced in time.

The input circuit 9 includes a gate 10 constituted by a threshold inverting amplifier driven by the command pulses through a capacitor 11 blocking the DC component and two series-connected resistors 12 and 13. The amplifier power terminals are connected between the negative terminal "−" and the positive terminal "+" of the cell to which the interface is connected. Two diodes 14 and 15 connected in series between the "−" and terminals of the associated cell are also included in this input circuit where they constitute a peak limiter circuit in which the anode of the diode 14 and the cathode of the diode 15 are connected to the common point of the resistors 12 and 13. A high-value resistor 16 shunting the diode 15 fixes the potential in the absence of any command pulse and completes this input circuit which is adapted to transmit the pulses of the command stream TI that it receives to an interface control circuit 17.

The latter includes two threshold inverting amplifier type gates 18 and 19 connected in parallel to the output of the gate 10 for synchronizing the phase of the input signal which is applied to a capacitor 20 via the gate 18 and to an input of an access control gate via the gate 19.

The capacitor 20 has one terminal connected to the output of the gate 18 by a diode 22 and a resistor 23 connected in series and a second terminal connected to the "−" terminal of the associated cell. It is charged by the first pulse of a command stream TI and remains substantially charged for the duration of the stream, as shown by diagram B in FIG. 5. A resistor 24 shunting the capacitor 20 discharges it at the end of a stream.

The common point of the capacitor 20 and the resistors 23 and 24 is connected to the input of a first of two inverters 25 and 26 connected in series on the upstream side of the data input D of a D-type flip-flop 27 and the reset RAZ input of this flip-flop. In the absence of pulses and consequently in the absence of charge at the capacitor 20 the data input D and the reset input RAZ of the flip-flop 27 are held at logic 0. The occurrence of a pulse stream TI at the input E produces a pulse which is delayed by the time to charge the capacitor 20 and whose duration is related to that of the stream received at the output of the inverter 26, as can be seen in diagram C in FIG. 5. Consequently, a signal at logic 1 is applied to the D input of the flip-flop 27. The clock input H of the flip-flop 27 is connected to the output of the gate 19 and its Q output copies the logic level at the D input. The complemented logic level is copied at the $\overline{Q}$ output. The reception of a first pulse of a command stream by an interface control circuit 17 causes this first pulse to be applied to the clock input H of the flip-flop 27 via the gate 19. At this time the RAZ input of this flip-flop is still at logic 0, which disables the flip-flop and bars copying.

The NAND type control gate 21 is connected to the output of the gate 19 at a first input and to the data output Q of the flip-flop 27 by a second input. It drives the output S of the interface via an inverter 28. It therefore transmits pulses it receives from the gate 19 under the control of the flip-flop 27, except for the first pulse of each new stream received by the interface which includes it, as at this time the gate 19 is disabled by the flip-flop 27, as shown in diagrams D and E of FIG. 5 which respectively show the signals at the Q output of the flip-flop 27 and at the output S of the circuit 17.

The end of a pulse at the output of the inverter 26, following on from the end of a stream of pulses, causes the flip-flop 27 to be reset when the capacitor 20 is discharged.

The flip-flop 27 also controls the current generator 4 of the interface 3 which includes it. In this example this current generator is constituted by a measurement amplifier 29 whose negative supply is under the control of the $\overline{Q}$ output of the flip-flip 27 via an NAND type gate 30.

A first input of the gate 30 is connected to the $\overline{Q}$ output of the flip-flop 27. A second input is connected to the inverter 26 and a third input is connected to the gate 19. It therefore controls the power supply to the measurement amplifier 29 during the interval between the first command stream pulse received at the input E of the interface 3 in question and the pulse received after that pulse, by controlling the state of the negative supply terminal of this amplifier, as shown in diagram F of FIG. 5.

The measurement amplifier 29 also has a power supply connection to the "+" terminal of the associated cell to which the interface 3 including it is connected. It has a non-inverting input connected to the common point of a divider bridge with two resistors 31, 32 connected between the "−" and "+" terminals of the associated cell to allow for the value of the voltage here. It also has an inverting input connected by a resistor 33 to the same "+" terminal and to the emitter of a PNP transistor 34 whose collector is connected to the single-wire output M by which the interface 3 is itself connected to the resistor constituting the transducer 5 common to all the cell interfaces. The measurement amplifier 29 is adapted to compare the voltages applied to it to inputs. When it is supplied with power, i.e. when a first pulse of a command stream TI is applied to the interface, the state at its output connected to the base of the transistor 34 causes the latter to supply to the resistor constituting the transducer 5 a current measurement signal conditioned by the voltage supplied to the interface 3 by the associated cell 1, as shown in diagram G of FIG. 5.

As mentioned above, in one embodiment of the invention it is possible to associate a second current generator 6 to compensate for the consumption due to the the measurement circuit at the level of a cell at the time of the measurement carried out on that cell by means of the associated interface 3.

In the embodiment considered here the second current generator 6 of an interface 3 essentially includes a compensator amplifier 35 which is commanded at the same time as the measurement amplifier of the interface 3 which includes it and which is adapted to supply on each measurement to the cell 1 to which the measurement relates and associated with the interface 3 a compensator current equivalent to that consumed on the occasion of this measurement.

To this end the inverting input of the compensator amplifier 35 of an interface 3 is connected to the output of the measurement amplifier 10 associated with it in the same interface via a resistor 36. Its output is connected to the base of an NPN transistor 37 whose emitter is connected to the resistor constituting the compensator 7 common to the cell interfaces 3 via the terminal C of the interface including it and whose collector is connected to the common ground via a resistor 38.

The compensator amplifier 35 of an interface 3 has its power supply connections connected between the "+" terminal of the cell 1 associated with the interface and the common ground. It has a non-inverting input conventionally connected to the point common to the two resistors 39 and 40 of a divider bridge connected between the "+" terminal of the associated cell and the common ground. It is therefore possible to obtain at an interface 3 and during a measurement carried out via an interface a compensator current supplied by the compensator amplifier 35 that it includes which has the same magnitude as the current consumed by the interface for the purposes of the measurement but of the opposite polarity as shown in diagram H of FIG. 5.

A pulsed current therefore flows through the resistor constituting the common transducer 5 (FIG. 1) as shown in diagram I of FIG. 5 when the pulses of a command stream TI are transmitted from an interface 3 to the next and each interface reserves to itself the first pulse of a command stream received by it in order to create a corresponding measurement pulse at the resistor constituting the transducer 5. As shown in diagram I of FIG. 5, the successive pulses for the same command stream TI form a stream TM in which the respective temporal positions of the pulses correspond to the respective positions of the interfaces 3, in the order in which these receive the pulses of the measurement stream.

Diagram H in FIG. 5 shows that a measurement pulse stream TM is equivalent to a complementary pulse stream at the common compensator 7 (FIG. 1), for the purposes stated above.

Figure 4:
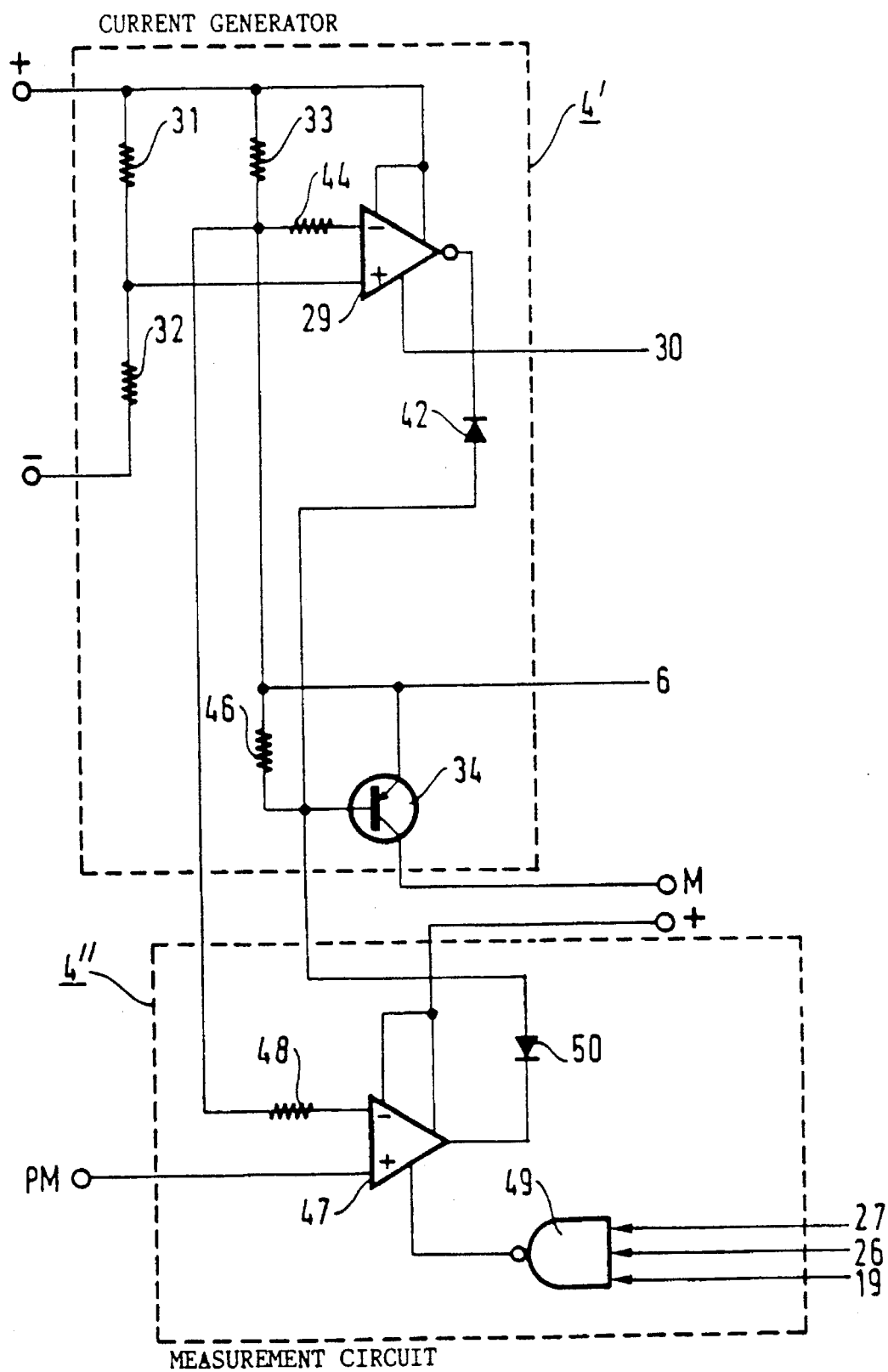
FIG. 4 is an electrical circuit schematic of an alternative implementation of part of the FIG. 3 circuit.

It is feasible to transmit more than one measurement indication from the same cell interface 3 if the interface is modified as shown in FIG. 4.

This substitutes for the current generator 4 a current generator 4' which has the same components 29, 31, 32, 33 and 34 as the latter and the same interconnections, apart from the differences explained below.

The output of the measurement amplifier 29 is connected to the base of the transistor 34 by a diode 42 and a resistor 43 connected in series. The inverting input of this amplifier is connected to one terminal of the resistor 33 via a resistor 44 and the point common to these two resistors is connected to the base of the transistor 34 by a resistor 45 and to an inverting input of a measurement amplifier 47 by a resistor 48 in an additional current generator 4". The non-inverting input of the measurement amplifier 47 is connected to a measurement point PM for a measurement other than that effected by the current generator 4', for example a temperature measurement at the associated cell 1.

The negative supply terminal of the measurement amplifier 29 is still connected to the output of the gate 13 of the control circuit 17 of the interface 3 which includes it an, if necessary, the emitter of the transistor 34 is still connected to the input resistor 36 of the second current generator 6 of this interface 3, where this second generator is provided. The negative supply terminal of the measurement amplifier 47 is under the control of a NAND type gate 49 one input of which is connected to the $\overline{Q}$ output of the flip-flop 27 which is part of the control circuit 17 described above. Second and third inputs of the gate 49 are respectively connected to the output of the inverter 26 and to the output of the gate 19 of the same control circuit 17. Accordingly the measurement amplifier 47 is controlled by the same signals as the measurement amplifier 29 except that the clock is inverted, in the sense that a measurement is initiated at the start of a command pulse, as soon as the corresponding capacitor 20 is charged, and continues for the duration of the pulse, as shown in dashed line in diagram F. The addition of the diode 42 having its anode connected to the base of the transistor 34 and a diode 50 having its anode connected to the base of the transistor 34 and its cathode connected to the output of the measurement amplifier together with the addition of the resistors 44, 46 and 48 means that the transistor 34 can be used for both current generators 4' and 4".

This produces an additional current shown in dashed line in diagram G and representing the measurement effected by the current generator 4" before that representing the different measurement effected by the current generator 4'.

It is possible to compensate for the current consumed during measurements effected at an interface 3 via the current generator 4" by supplying additional current to this interface from the second current generator 6, likewise in respect of the current consumed during a measurement effected via the current generator 4' at this same interface, as shown in diagram H of FIG. 5 in which the two compensations are shown, one in dashed line relating to the current generator 4' and the other in full line related to the current generator 4".

The pulsed measurement current in the resistor constituting the common transducer 5 consequently corresponds to the sum of the two stream of pulses respectively due to the two current generators 4' and 4" whose pulses alternate, as shown in diagram I of FIG. 5. This produces a compensator current at the compensator 7 as shown in diagram J.

There is claimed:

1. A measurement circuit for a modular system of cells electrically connected in series and each constituted by one or more electrical energy elements, said circuit comprising individual measurement interfaces each respectively connected to the power terminals of a different cell and each including a single-wire measurement output for carrying a current measurement signal to be transmitted to a common transducer to which the respective measurement outputs of the interfaces are connected in common via a common single-wire connection, each interface incorporating at least a first current generator for generating a current measurement signal relating to a change in the characteristic of the corresponding cell, the interfaces being connected in series by successive elements of a single-wire link capable of serially transmitting individual switching control pulses grouped into streams, each interface having a control circuit adapted to respond to a first control pulse of a stream of received control pulses by turning on the first current generator of the interface and transmitting any subsequent pulses of the same stream to any downstream interface whose input is connected to a control output of the interface via an element of the single-wire link.

2. The measurement circuit according to claim 1 wherein each individual interface incorporates an input circuit including a direct current component blocking capacitor for receiving streams of control pulses, and wherein the control circuit of the interface is connected to the output of the input circuit of the interface and to a control input of the first current generator of the interface in order to turn on said first current generator upon receiving the first control pulse and to transmit to any downstream interfaces any pulses which may follow said first control pulse in the stream of received control pulses.

3. Measurement circuit according to claim 2 wherein each individual interface is also connected to a terminal of a common compensator by means of a second individual current generator turned on with the first current generator of the interface and connected to balance at the various cells all energy measurements initiated by a measurements pulse stream.

4. Measurement circuit according to claim 3 wherein each individual interface includes an additional current generator for converting into the form of a current a second change in characteristic of the cell corresponding to the interface, said additional current generator being connected to the common transducer in parallel with said first current generator of said interface and switched alternately therewith during the stream containing the command pulse of said first generator.

\* \* \* \* \*